United States Patent
Hermann et al.

(10) Patent No.: US 9,267,975 B2
(45) Date of Patent: *Feb. 23, 2016

(54) FAST RESPONSE CAPACITIVE GAUGING SYSTEM FEATURING STEEP SLOPE FILTER DISCRIMINATION CIRCUIT

(71) Applicant: Laser Mechanisms, Inc., Novi, MI (US)

(72) Inventors: Gerald F. Hermann, Westland, MI (US); Daniel R. Buckley, Canton, MI (US); Scott D. Swartzinski, Plymouth, MI (US)

(73) Assignee: LASER MECHANISMS, INC., Novi, MI (US)

( * ) Notice: Subject to any disclaimer, the term of this patent is extended or adjusted under 35 U.S.C. 154(b) by 173 days.

This patent is subject to a terminal disclaimer.

(21) Appl. No.: 13/832,823

(22) Filed: Mar. 15, 2013

(65) Prior Publication Data

US 2014/0103944 A1    Apr. 17, 2014

Related U.S. Application Data

(63) Continuation-in-part of application No. 12/887,780, filed on Sep. 22, 2010, now Pat. No. 8,405,409.

(60) Provisional application No. 61/244,742, filed on Sep. 22, 2009.

(51) Int. Cl.
| | |
|---|---|
| *G01R 27/26* | (2006.01) |
| *B23K 26/04* | (2014.01) |
| *G01B 7/02* | (2006.01) |
| *B23K 26/36* | (2014.01) |
| *B23K 26/38* | (2014.01) |

(Continued)

(52) U.S. Cl.
CPC .............. *G01R 27/26* (2013.01); *B23K 26/048* (2013.01); *B23K 26/36* (2013.01); *B23K 26/364* (2015.10); *B23K 26/38* (2013.01); *B23K 26/402* (2013.01); *G01B 7/023* (2013.01); *B23K 2203/42* (2015.10); *B29C 66/8246* (2013.01); *B29C 66/95* (2013.01)

(58) Field of Classification Search
CPC ................ B23K 26/048; B23K 26/36–26/367; B23K 26/4065; G01R 27/26–27/2605; G01B 7/023
USPC .................................................. 324/658–690
See application file for complete search history.

(56) References Cited

U.S. PATENT DOCUMENTS

| | | | |
|---|---|---|---|
| 3,226,527 A | 12/1965 | Harding | |
| 4,298,784 A * | 11/1981 | Schmall | 219/124.02 |
| 4,528,451 A * | 7/1985 | Petric et al. | 250/441.11 |

(Continued)

FOREIGN PATENT DOCUMENTS

| | | |
|---|---|---|
| DE | 42 05 759 A1 | 8/1993 |
| JP | 07-195188 | 1/1995 |

*Primary Examiner* — Patrick Assouad
*Assistant Examiner* — Demetrius Pretlow
(74) *Attorney, Agent, or Firm* — Harness, Dickey & Pierce, P.L.C.

(57) ABSTRACT

The high speed, high accuracy capacitive gauging system employs an oscillator fed through steep slope filter that is discriminates between very small changes in capacitance even in the presence of electrical noise. During intervals when the probe tip is retracted, the oscillator frequency is calibrated to match the sweet spot in the center of the linear operative region of the steep slope filter. This calibrates the system to overcome the effects of varying temperature and humidity in the manufacturing environment.

12 Claims, 3 Drawing Sheets

(51) Int. Cl.
*B23K 26/40* (2014.01)
*B29C 65/00* (2006.01)

(56) References Cited

U.S. PATENT DOCUMENTS

| | | | |
|---|---|---|---|
| 5,428,280 A | 6/1995 | Schmidt et al. | |
| 5,942,975 A | 8/1999 | Sorensen | |
| 6,304,091 B1 | 10/2001 | Shahoian et al. | |
| 6,509,744 B1* | 1/2003 | Biermann et al. | 324/662 |
| 6,563,130 B2* | 5/2003 | Dworkowski et al. | 250/559.33 |
| 6,597,449 B1 | 7/2003 | Smolka et al. | |
| 2001/0024126 A1 | 9/2001 | Sporl et al. | |
| 2002/0063221 A1 | 5/2002 | Li | |
| 2003/0102294 A1 | 6/2003 | Kinbara et al. | |
| 2004/0260500 A1* | 12/2004 | Punzenberger et al. | 702/107 |
| 2007/0229152 A1* | 10/2007 | Kosai | 330/100 |
| 2008/0116184 A1* | 5/2008 | Fredrick et al. | 219/121.81 |
| 2009/0015268 A1* | 1/2009 | Gardner et al. | 324/662 |
| 2011/0089956 A1 | 4/2011 | Hermann et al. | |

* cited by examiner

FAST RESPONSE CAPACITIVE GAUGING SYSTEM FEATURING STEEP SLOPE FILTER DISCRIMINATION CIRCUIT

CROSS-REFERENCE TO RELATED APPLICATIONS

This application is a continuation-in-part application of U.S. patent application Ser. No. 12/887,780, filed on Sep. 22, 2010, which claims the benefit of U.S. Provisional Application No. 61/244,742, filed on Sep. 22, 2009. The entire disclosure of each of the above applications is incorporated herein by reference.

FIELD

The present disclosure relates generally to capacitive gauging systems and more particularly to an improved capacitive gauging system for use in applications such as industrial laser processing, including but not limited to cutting, scribing, ablating and welding, and for use in other applications where the position of a moving member is controlled or measured using capacitive gauging. The system described herein can provide a means of measuring the tip-to-part standoff distance, for example. This distance measurement may be used as feedback to a servo loop to maintain a constant tip-to-part standoff, for example.

BACKGROUND

This section provides background information related to the present disclosure which is not necessarily prior art. In capacitive gauging systems there are applications, such as laser processing, where extremely fast response times, noise immunity and compensation of background capacitance are essential. The ability of a system to excel in these features would make a product more effective and superior to other designs.

For example, maintaining a constant standoff height is advantageous in a laser process, as it keeps the laser focus consistent in relation to the part, as well as keeping the gas flow dynamics consistent. Using capacitance to measure the tip-to-part standoff distance is the preferred method for laser processing; however there exists some significant design challenges. Among these challenges are:

a) Fast laser processing results in proportionally fast tip-to-part standoff compensation. Typical response times for capacitive gauging systems are slower than 2 msec, and thus place a practical limit on laser processing speeds.
b) Industrial laser processing is inherently electrically noisy. The plasma and ejected molten metal can interfere with the capacitance thus disrupting the ability of the system to accurately measure the tip-to-part standoff. The typical way of dealing with this interference is to filter it out with a low pass filter with a cut-off frequency of ~500 Hz., again resulting in a relatively slow response time that degrades overall laser processing speed.
c) The capacitance variation seen between the tip and the part can be less than a picofarad. For this reason, keeping the background capacitance constant is essential for accurate tip-to-part gauging. However, variations in temperature, humidity and other external influences can alter the background capacitance, causing significant errors in the tip-to-part measurement. Conventional systems have difficulty dealing with this error.

SUMMARY

This section provides a general summary of the disclosure, and is not a comprehensive disclosure of its full scope or all of its features.

The improved capacitive gauging system described more fully herein has a unique analog circuit that employs a carefully calibrated capacitance-responsive oscillator and a high-frequency, high-order, low pass filter to process the output of the oscillator and thus measure minute changes in capacitance even when those changes occur very rapidly. The improved gauging system has a potential response time of faster than 0.01 msec and is thus considerably faster to respond than conventional (2 msec) capacitive gauging systems.

Instead of using a conventional 500 Hz. low pass filter to filter out laser-induced noise (at the expense of speed), the improved capacitive gauging system uses its high-frequency, high-order, low pass filter to rapidly discriminate between minute changes in capacitance. Thus the improved capacitive gauging system concentrates on quick recovery from noise, instead of attempting to filter it out.

To address environmental variances (e.g., in temperature and/or humidity) the improved capacitive gauging system uses a compensation circuit to adjust for the background capacitance when the tip is a relatively far distance away from the part. The compensation circuit is engaged at intervals between the cutting, scribing, ablating and/or welding processes. It accurately calibrates the oscillator to match the "sweet spot" of the high-frequency, high-order, low pass filter, so that the filter can continue to discriminate very small changes in capacitance as the probe tip-to-part distance changes.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Figure 1:
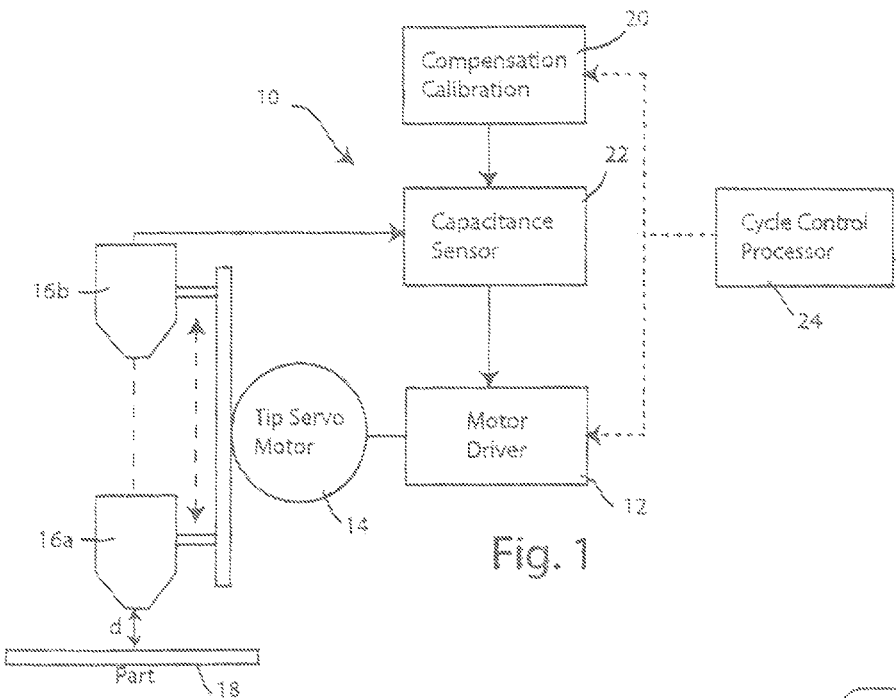
FIG. 1 is a block diagram of the improved capacitive gauging system shown in context with the servomotor system used to drive the up-down movement of the tip relative to the part.

With reference to FIG. 1, the improved capacitive gauging system is shown generally at 10. As illustrated, the gauging system supplies a control signal to the motor driver circuit 12, which in turn controls the up-down motion of the tip servomotor 14. For illustration purposes, FIG. 1 shows the tip 16 in two positions: position 16a—in working proximity to the part 18 and position 16b—in retracted position. It will be understood that during use, the servomotor 14 is controlled to maintain the proper working distance (d) between tip 16 and part 18. As will be more fully described below, from time to time, such as between intervals of working interaction between tip and part (e.g., during cutting, scribing, ablating and/or welding), the servomotor 14 retracts the tip to position 16b. When retracted to position 16b, the compensation calibration circuit 20 performs a calibration operation upon the capacitance sensor 22. Details of the compensation calibration circuit 20 and capacitance sensor 22 are provided below in connection with FIG. 2.

The improved capacitive gauging system employs a unique analog circuit that performs highly accurate and rapid capacitive sensing. A digital circuit, cycle control processor 24 mediates the operation of this analog circuit. The cycle control processor 24 sends digital control instructions to the motor driver 12 to cause the tip servomotor 14 to retract the tip to position 16b. This retraction motion would typically be performed after a particular working interaction between tip and part have completed, such as when it is time to remove a finished part and insert a fresh part to be worked upon. Upon retraction of the tip, the cycle control processor 24 sends digital control instructions to the compensation calibration circuit 20, causing it to calibrate the capacitance sensor 22 for its next use.

Figure 2:
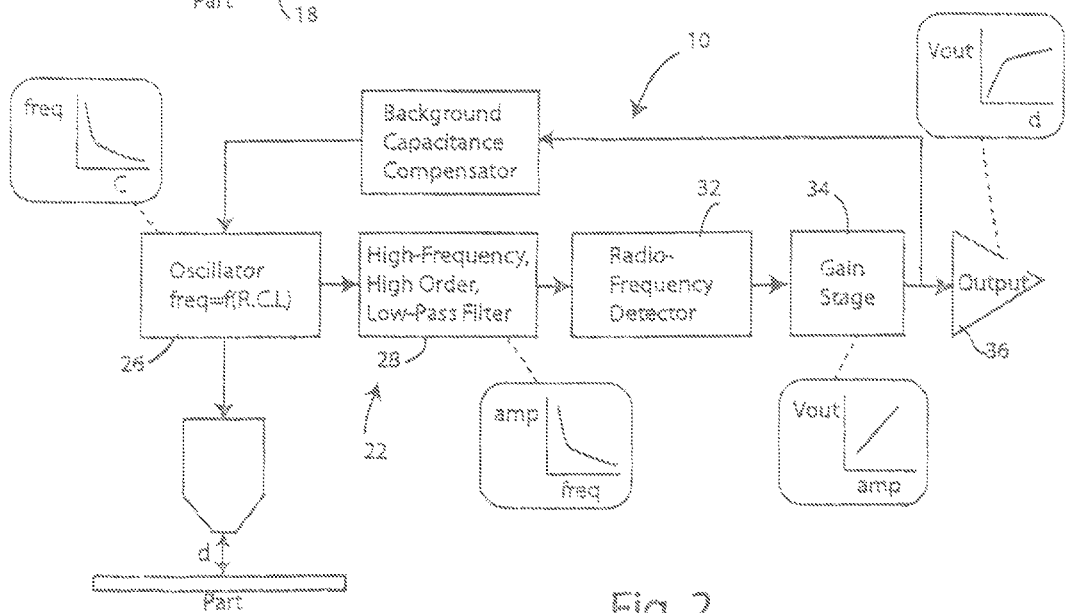
FIG. 2 is a detailed block diagram of the improved capacitive gauging system, with superimposed graphs showing various relationships among distance (d), capacitance (C), frequency (freq), amplitude (amp) and voltage out (Vout)

Referring now to FIG. 2, the capacitance sensor 22 of the improved capacitive gauging system 10 employs an oscillator 26. The frequency generated by the oscillator is a function of resistance (R), capacitance (C) and/or inductance (L). The capacitance (C) portion of the function is itself a function of the distance (d) between the tip and the part. As the distance between the tip and the part changes, the capacitance changes, resulting in a change in the oscillator frequency. The resulting frequency is nominally between 1 KHz and 1 GHz. The oscillator can be based on a LM 555 timer circuit in "Astable operations" mode (see data sheet www.natural.com/ds/LM555.pdf) optional modification to this circuit can be used to reduce the circuit's susceptibility to temperature variations. For example, the circuit can be separated into an input buffer, comparator, and flip-flop.

Figure 3:
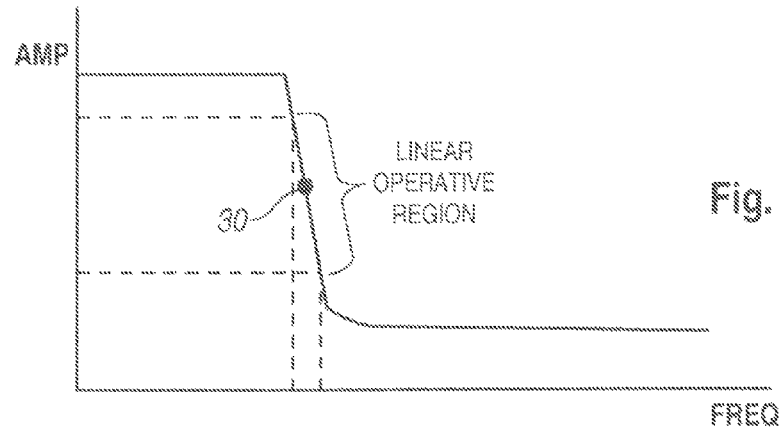
FIG. 3 is a graph showing how filter slope affects discrimination ability of the capacitance sensor.

The output of the oscillator 10 is sent through a high-frequency, high-order (steep slope) low-pass filter 28. The low pass filter 28 can be implemented as active filter with a cut-off frequency close to the operating frequency of the oscillator. In a presently preferred embodiment filter 28 is a $7^{th}$ order filter, which provides a very steep cut-off curve. In general, the steeper the cut-off curve, the more sensitive the resulting system will be. The resulting output of filter 28 will have an amplitude that increases as the frequency decreases. This can be illustrated with reference to FIG. 3, which shows the slope of an exemplary low-pass filter. Note that the filter is designed with its "sweet spot" 30 centered at a frequency that matches the nominal frequency of the oscillator 26 when the tip is in its retracted position 16b. Because of the steep cut-off slope, a small change in oscillator frequency (x-axis) will produce a large change in filter output amplitude (y-axis). In order to achieve the high order (greater than 4) of filtering, commercially available active filters are implemented with appropriate support circuitry (e.g., datasheets.maxim-ic.com/en/ds/max280-mxl1062.pdf).

While a high-frequency, high-order low-pass filter is presently preferred, the capacitance sensor 22 may also be implemented using a high-pass filter or notch filter. Essentially, any filter that provides a steep slope that can produce a large change in filter output for a small change in oscillator frequency will work. If a high-pass filter is chosen, for example, the curve illustrated in FIG. 3 would be flipped so that linear operative region would slope in the opposite direction. While this would change the polarity of the filter output, essentially the same frequency discrimination can be had.

To measure the output amplitude of filter 28, the capacitance sensor 22 employs a radio-frequency detector 32. The radio frequency detector is tuned to receive frequencies covering the frequencies associated with the linear operative region of filter 28. The radio-frequency detector 32 thus produces an output signal that, in effect, converts the varying amplitude output of filter 28 into a varying voltage ($V_{out}$). The RF detector 32 produces a DC voltage that is proportional to the power in the signal that results from the bypass filter (low-pass) 28. The RF detector can be implemented using a diode based rectifier circuitry or dedicated integrate circuit (see datasheets.maxim-ic.com/en/ds/max2016.pdf). To improve signal response, a suitable gain stage 34 may be included, with its amplified output fed to a final output stage 36 which feeds and/or comprises part of the motor driver circuit 12 (FIG. 1). The motor output stage optimizes the signal and conditions it for use as a gauging system. This signal thus feeds the tip servomotor 14 which translates the $V_{out}$ signal into a physical position (d). The gain stage can be a standard op-amp based differential filter.

To work effectively, the sweet spot 30 of the filter (FIG. 3) should be positioned at or near the nominal frequency of the oscillator 26. As explained above, the oscillator frequency varies in relation to the sensed capacitance. Capacitance, in turn, varies as the distance between tip and part changes. However, capacitance is also affected by environmental conditions, such as temperature and humidity, and these environmental factors can significantly degrade accuracy. To compensate for environmental variances, the improved capacitive gauging system employs a compensation calibration circuit 20, which utilizes a background capacitance compensator circuit 38. Compensator circuit 38, when engaged, forms a feedback loop between the output of gain stage 34 and the oscillator 26. The compensator circuit 38 is selectively connected (in response to instruction from the cycle control processor 24, FIG. 1) when the tip is in its retracted position 16b. The background capacitance compensator circuit uses closed loop feedback control to accurately set the oscillator frequency of oscillator 26 by adjusting parameters of the oscillator frequency function to normalize the resulting signal when the tip is far from the part, or some other known position.

Figure 4:
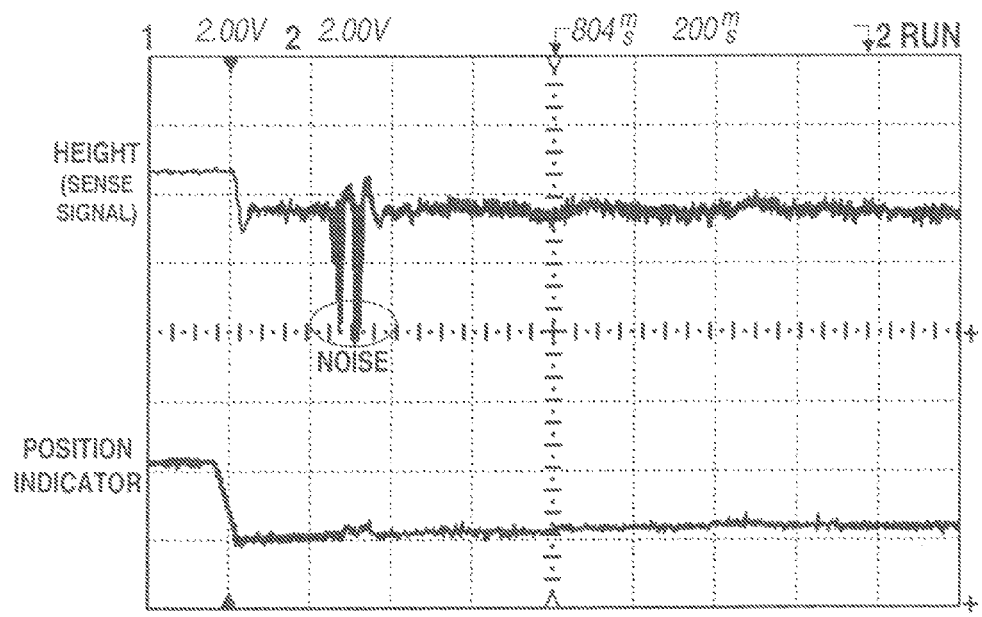
FIG. 4 is an oscilloscope waveform diagram showing how the height (sense signal) produced by the capacitive sensor compares with the position indicator produced by the gauging system in the presence of noise.

Unlike conventional capacitive gauging systems, which employ heavy low pass filtration (e.g. 500 Hz.) to filter out laser process-induced noise, the improved capacitive gauging system is able to operate in the presence of noise. To illustrate, refer to FIG. 4, which shows the output of a dual trace oscilloscope. The uppermost waveform depicts the output of the capacitive sense signal and the lowermost waveform depicts the position indicator output of the gauging system. Note that the capacitive sense signal has a lot of noise that is created by the laser process and is detected by the height sensing circuit. Even in the presence of this noise, the resulting motion shown on the bottommost waveform shows negligible noise.

According to the present teachings, the system described above can be used to detect the distance between the laser processing head and a polymer work piece. The capacitive sense signal from the capacitance sensor 22 of the improved capacitive gauging system 10 employs an oscillator 26. The frequency generated by the oscillator is a function of resistance (R), capacitance (C) and/or inductance (L). The capacitance (C) portion of the function is itself a function of the distance (d) between the tip and the part. As the distance between the tip and the part changes, the capacitance changes, resulting in a change in the oscillator frequency.

In the case where the workpiece is a non-conductive polymer, it is thought changes in the proximity of the laser head to a polymer work piece changes the dielectric constant. This change causes a change in the capacitive sense signal. As described above, the change in signal is used to control the movement of the servo motor to control the operating characteristics of the system.

As described further in detail below, the system described above, with some modification, can be used to control the height of the laser head above a polymer component or work piece. This modification will allow the use of a cutting laser to accurately process polymer components. The height sensing circuit detects variations in the capacitance of the tip in relation to for instance earth ground. In the previously described system, the metal workpiece can be electrically connected to earth ground. As polymer components are typically non-conductive, the system described herein also can use a measurement of capacitance to earth ground. As described above, changes in capacitance are converted to a change in frequency. The variations in frequency are converted to a voltage and used in a servo loop to maintain a constant tip-to-surface gap (standoff height).

Figure 5:
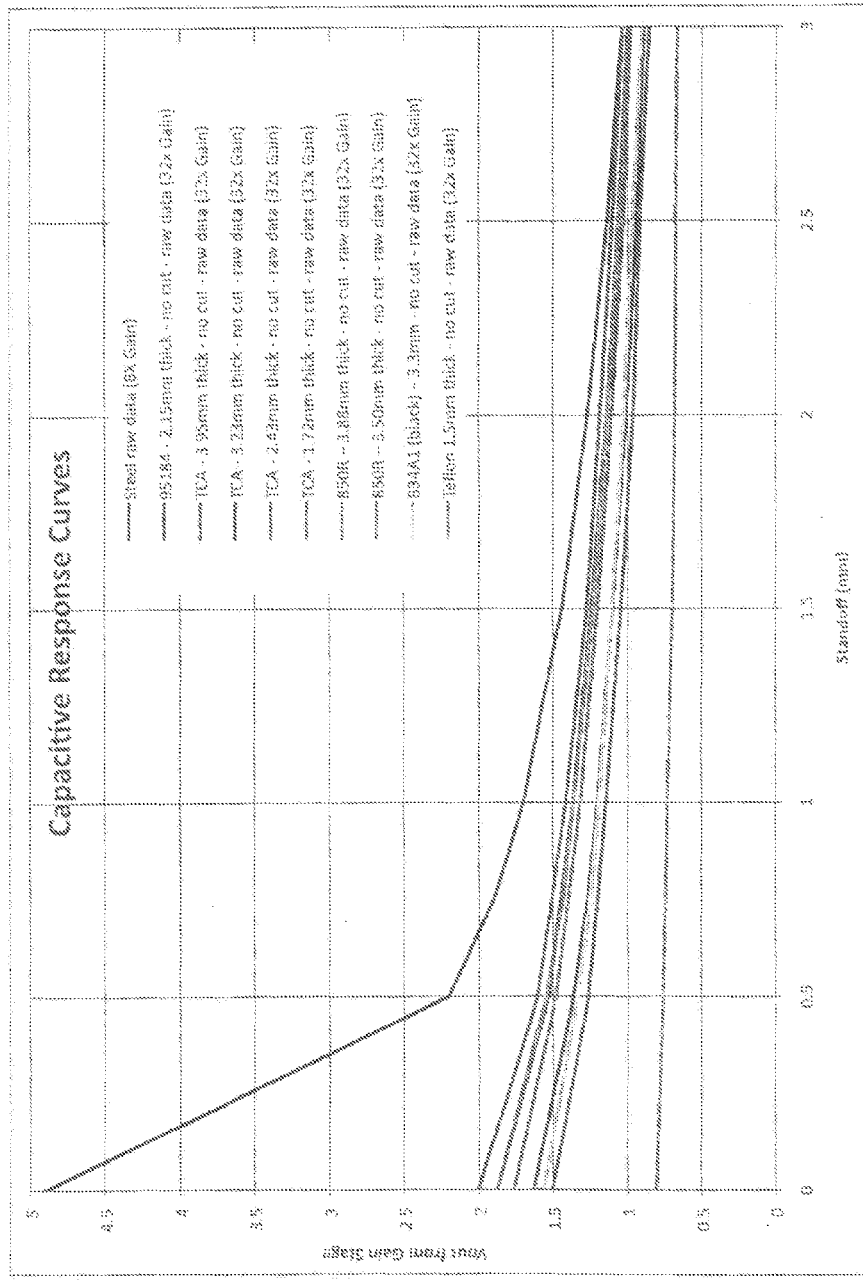
FIG. 5 represents response curves of the system used to detect different materials.

FIG. 5 represents the various capacitive response curves for different materials. Briefly returning to FIG. 2 is the Gain Stage 32 can be adjusted to detect different materials. To detect metal, the gain can be set to for instance 8×. To plastic components in the vicinity of the head, the gain at stage 32 can be set to 32×. The output stage, 36, is then adjusted to linearize the output.

The detected amount of variation in capacitance of the tip in relation to a plastic part is extremely small. In order to effectively sense a plastic part the gain of the circuit can be extremely high. With the gain set this high the circuit becomes sensitive to variations in environmental conditions such as temperature and humidity. Associated with laser processing of materials is the assist gas type, pressure, temperature and humidity may affect the height sensing of plastic parts. Controlling these conditions may be important to successful operation. Control of the environment in a manufacturing environment would therefore be helpful. This would include keeping air around the laser head clean and dry.

Doing a quick recalibration of the height sensor after each cut is standard for Laser Mech FiberCut head to help keep the process consistent. However, this process may be critical for plastic cutting due to the high gain setting and sensitivity to environmental variations in temperature, humidity, assist gas The height sensor disclosed herein has the ability to store multiple curve characteristics for various materials being cut. In this regard, the height sensor may be associated with a robotic arm which will position the cutting head at various locations along a work piece. Background capacitance can vary significantly depending on the structural environment. This can include variation based on for example polymer work piece thickness. Originally these "curves" were intended to allow selection of different tip styles. However this same technology can be utilized to allow selection of different material types. Switching between curves and recalibration can happen in a matter of ~50 msec.

It has been noted the capacitive response of the plastic material changes while laser cutting. Typical characterization of the capacitive response with metallic parts is performed without laser cutting. However, with plastic it may be advantageous or necessary to characterize the response while performing a test cut.

From the foregoing it will be seen that the improved capacitive gauging system advantageously utilizes a blend of analog and digital circuitry to produce fast and highly accurate measurements even in the presence of noise. The system uses the tip retraction intervals to perform environmental calibration, thus ensuring high accuracy even in the face of temperature and humidity variations.

While the improved capacitive gauging system has been illustrated and described in its presently preferred form, it will be understood that certain modifications can be made to the circuitry or selected components without departing from the spirit of our inventive concept.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A capacitive sensing system for measuring the height of a laser head above a plastic work piece, said system comprising:
   a laser head nozzle forming a first plate of a capacitor; the plastic work piece forming a dielectric portion of the capacitor;
   a capacitive-responsive radio frequency oscillator operably coupled to the capacitor, said oscillator providing an output; and
   a high-frequency, high-order bypass filter to process the output from the oscillator to measure minute changes in capacitance of the capacitor; and
   a radio-frequency detector coupled to the high frequency high-order bypass filter, wherein the radio frequency detector converts a varying output of the filter into a varying voltage.

2. The capacitive sensing system of claim 1, further comprising an actuator configured to move the laser head nozzle in response to the minute changes in capacitance of the capacitor.

3. The capacitive sensing system according to claim 1, wherein the high-order bypass filter has a response time of faster than about 0.01 msec.

4. The capacitive sensing system according to claim 1, further comprising a temperature/humidity compensation circuit configured to compensate for changes in background capacitance.

5. The capacitive sensing system according to claim 4, further comprising a controller configured to engage the compensative circuit at intervals between successive activation of the laser nozzle.

6. The capacitive sensing system according to claim 5, wherein the successive activation of the nozzle is associated with one of cutting the work piece, scribing the work piece, ablating the work piece, welding the work piece, and combinations thereof.

7. The capacitive sensing system according to claim 1, wherein the bypass filter is one of a low-pass filter, a high-pass filter, and a notch-filter.

8. A sensing system for a laser, the system comprising:
a laser having a nozzle;
an actuation mechanism coupled to the nozzle;
a capacitive sensing system comprising a capacitor formed of the nozzle and a polymer work piece;
a capacitive response oscillator operably coupled to the capacitive sensing system, said capacitive response oscillator varying from a first radio frequency to a second radio frequency in response to changes in capacitance of the capacitive sensing system;
a high-order bypass filter to process an output signal from the capacitive response oscillator, said high-order bypass filter being a greater than $4^{th}$ order bypass filter; and
a radio frequency detector configured to convert a varying output of the filter into a varying voltage, wherein said actuator mechanism is operably coupled to the radio frequency detector to move the nozzle in response to the varying voltage.

9. The sensing system according to claim 8, further comprising a capacitive compensation circuit operably coupled to the bypass filter.

10. The sensing system according to claim 9, wherein the compensation circuit forms a feedback loop between an input of a gain stage and the oscillator.

11. The sensing system according to claim 10, wherein the compensation circuit is selectively engaged when the nozzle is in an unengaged condition.

12. The sensing system according to claim 8, wherein the bypass filter is a high-order low-pass filter.

* * * * *